(12) United States Patent
Agarwal et al.

(10) Patent No.: US 11,054,470 B1
(45) Date of Patent: Jul. 6, 2021

(54) DOUBLE EDGE TRIGGERED MUX-D SCAN FLIP-FLOP

(71) Applicant: Intel Corporation, Santa Clara, CA (US)

(72) Inventors: Amit Agarwal, Hillsboro, OR (US); Steven Hsu, Lake Oswego, OR (US); Anupama Ambardar Thaploo, Folsom, CA (US); Simeon Realov, Portland, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 16/725,689

(22) Filed: Dec. 23, 2019

(51) Int. Cl.
*G01R 31/3185* (2006.01)
*G01R 31/317* (2006.01)
*H03K 3/037* (2006.01)
*G01R 31/3177* (2006.01)
*H03K 3/038* (2006.01)

(52) U.S. Cl.
CPC ... *G01R 31/318541* (2013.01); *G01R 31/317* (2013.01); *G01R 31/3177* (2013.01); *G01R 31/31723* (2013.01); *G01R 31/318525* (2013.01); *G01R 31/318536* (2013.01); *G01R 31/318583* (2013.01); *G01R 31/318586* (2013.01); *G01R 31/318597* (2013.01); *H03K 3/038* (2013.01); *H03K 3/0372* (2013.01)

(58) Field of Classification Search
CPC ...... G01R 31/318541; G01R 31/31723; G01R 31/3177; G01R 31/317; G01R 31/318583; G01R 31/318586; G01R 31/318597; G01R 31/318525; G01R 31/318536; H03K 3/0372; H03K 3/038
USPC .......................... 714/727, 726, 729
See application file for complete search history.

(56) References Cited

U.S. PATENT DOCUMENTS

| | | | | |
|---|---|---|---|---|
| 6,938,225 | B2* | 8/2005 | Kundu | G01R 31/318541 714/727 |
| 7,825,689 | B1* | 11/2010 | Vasishta | H03K 3/0375 326/46 |
| 8,552,779 | B2* | 10/2013 | Jones | H03K 3/356173 327/212 |
| 9,599,672 | B2* | 3/2017 | Abhishek | G01R 31/318552 |
| 9,612,281 | B2* | 4/2017 | Lou | G01R 31/318552 |
| 2003/0218488 | A1* | 11/2003 | Parulkar | G01R 31/318541 327/218 |
| 2004/0041610 | A1* | 3/2004 | Kundu | G01R 31/318541 327/215 |

(Continued)

OTHER PUBLICATIONS

Ahlawat et al., A High Performance Scan Flip-Flop Design for Serial and Mixed Mode Scan Test, Jun. 2018, IEEE, vol. 18, No. 2, pp. 321-331 (Year: 2018).*

(Continued)

*Primary Examiner* — John J Tabone, Jr.
(74) *Attorney, Agent, or Firm* — Green, Howard & Mughal LLP

(57) ABSTRACT

A family of novel, low power, min-drive strength, double-edge triggered (DET) input data multiplexer (Mux-D) scan flip-flop (FF) is provided. The flip-flop takes the advantage of no state node in the slave to remove data inverters in a traditional DET FF to save power, without affecting the flip-flop functionality under coupling/glitch scenarios.

20 Claims, 7 Drawing Sheets

(56) References Cited

U.S. PATENT DOCUMENTS

| | | | |
|---|---|---|---|
| 2004/0124881 A1* | 7/2004 | Thadikaran | G06F 11/2236 326/93 |
| 2008/0218234 A1* | 9/2008 | Jain | H03K 19/0013 327/202 |
| 2013/0093485 A1* | 4/2013 | Runas | H03K 5/08 327/178 |
| 2013/0135017 A1* | 5/2013 | Jones | H03K 3/356173 327/142 |
| 2014/0049286 A1* | 2/2014 | Clark | H03K 19/018521 326/16 |
| 2016/0146887 A1* | 5/2016 | Lou | G01R 31/318552 714/731 |
| 2016/0169966 A1* | 6/2016 | Abshishek | G01R 31/318541 714/727 |
| 2018/0278243 A1* | 9/2018 | Agarwal | H03K 19/20 |
| 2020/0389156 A1* | 12/2020 | Gupta | H03K 19/21 |

OTHER PUBLICATIONS

Ahlawat et al., A New Scan Flip Flop Design to Eliminate Performance Penalty of Scan, 2015, IEEE, pp. 25-30. (Year: 2015).*
Ahlawat et al., On Minimization of Test Power through Modified Scan Flip-Flop, 2016, IEEE, pp. 1-6. (Year: 2016).*
Hossain et al. Low Power Design using Double Edge Triggered Flip-Flops, Jun. 1994, IEEE, pp. 261-265. (Year: 1994).*
Pedram et al., New Design for Double Edge Triggered Flip-flops, 1998, IEEE, pp. 1-5. (Year: 1998).*

* cited by examiner

DOUBLE EDGE TRIGGERED MUX-D SCAN FLIP-FLOP

BACKGROUND

High performance designs for modern microprocessors, discrete graphics, digital signal processors (DSP's), and hardware accelerators in laptops, and servers are increasingly becoming an important factor due to the advent of new applications such as artificial intelligence (AI), machine learning, autonomous driving, and security/crypto currency. A major component of the power dissipation in such digital systems is due to charging and discharging load capacitance of circuit nodes, otherwise known as dynamic power. In today's clocked synchronous systems (e.g., microprocessors, DSP's, AI/machine learning, and servers), a large percentage of the overall power dissipation (e.g., greater than 50%) is in the clock grid and final sequential load.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
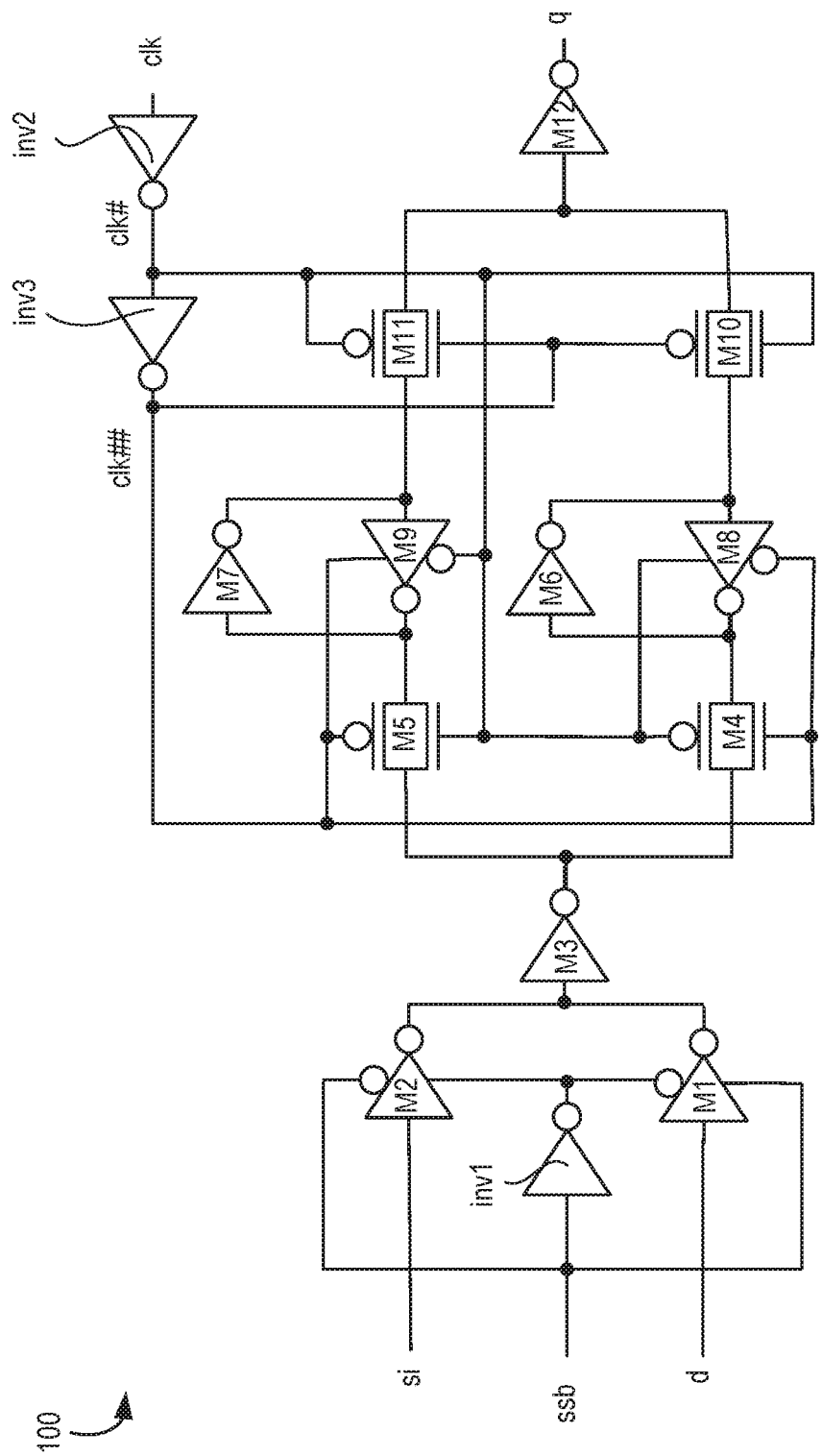
FIG. 1 illustrates a dual-edge triggered (DET) input data multiplexer (Mux-D) scan flip-flop (FF).

Various embodiments disclose a family of novel low power, min-drive (minimum drive) strength dual-edge (or double edge) triggered (DET) input data multiplexer (Mux-D) scan flip-flop. The flip-flop of various embodiments takes advantage of no state node in the slave latch to remove data inverters in conventional DET flip-flop to save power, without affecting the flip-flop functionality under coupling/glitch cases.

There are many technical effects of various embodiments. For example, a family of low power, min-drive strength DET Mux-D scan flip-flop are achieved including Tri-Tri FF, Tri-Tran FF, and Tran-Tran FF. Tri-Tri DET flip-flop exhibits ISO-performance at small load with lower power (e.g., 19% over single-edge triggered (SET) flip-flop) compared to conventional DET flip-flop. Tri-Tran DET exhibits ISO performance at large load with lower power (e.g., 14% over SET flip-flop) compared to conventional DET flip-flop. Tran-Tran DET exhibits higher performance at large load with lower power (e.g., 12% over SET flip-flop) compared to conventional DET flip-flop. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a dual-edge triggered (DET) input data multiplexer (Mux-D) scan flip-flop (FF) 100. One way to reduce this clock power contribution is to operate clock at half frequency while converting all the sequential units to a double-edge-triggered (DET) FF, which stores the data at both edge (rising and falling) of the clock, to preserve frequency. Running the clock at half frequency reduces clock switching by half, improving clock grid power by approximately 50%. Triggering at both clock edges requires that the DET flip-flop be implemented with more number of clock transistors compared to a single-edge-triggered (SET) FF.

FF 100 illustrates one such DET FF. FF 100 consists of scan input multiplexer including inverter inv1, and tristate inverters M1 and M2. Tristate inverter M1 receives data input d. Tristate inverter M2 receives scan input si. One of the tristate inverters M1 and M2 drives inverter M3 that is coupled to the DET FF. The tristate inverters M1 and M2 are controlled by a scan select or enable signal ssb. FF 100 has two master latches. The first master latch comprises transmission pass-gate M5 and a memory element (M7 and M9), where M7 is an inverter and M9 is a tristate inverter. The second master latch comprises transmission pass-gate M4 and a memory element (M6 and M8), where M6 is an inverter and M8 is a tristate inverter. The output of the first master latch is coupled to the input of inverter M12 via transmission gate M11. The output of the second master latch is coupled to the input of inverter M12 via transmission gate M10. Inverter M12 then inverts the output (one of first or second master latches) and generates output q. The tristate inverters M8 and M9, and transmission pass-gates M4, M5, M10, and M11 are controlled by clock signals clk# and clk## generated by inverters inv2 and inv3. Here, the suffix '#' indicates an inversion. For example, clk# is an inversion of clk. Here, signal names and node names are interchangeably used. For example, ssb may refer to signal ssb or node ssb depending on the context of the sentence.

Figure 2:
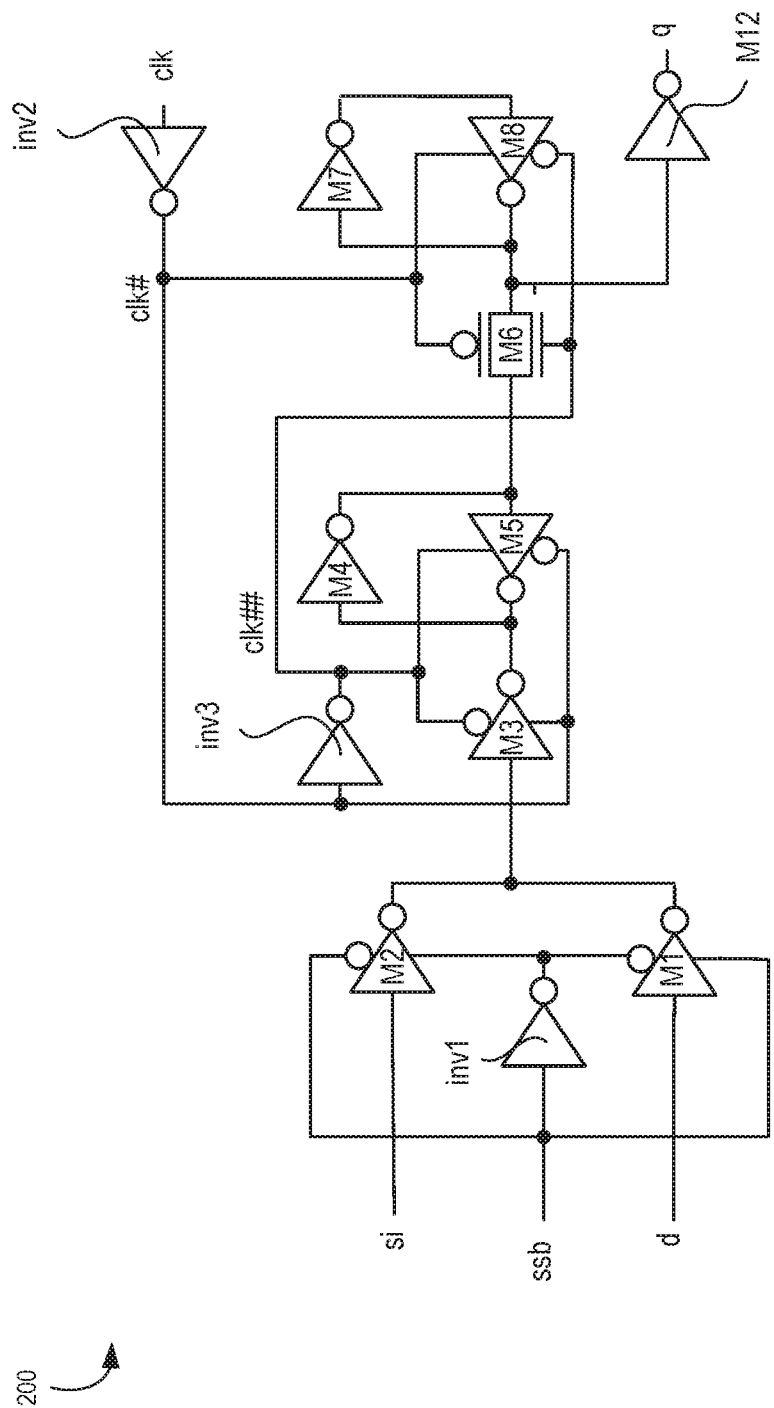
FIG. 2 illustrates a single-edge triggered input data multiplexer (Mux-D) scan FF.

FIG. 2 illustrates a single-edge triggered (SET) input data multiplexer (Mux-D) scan FF 200. FF 200 consists of scan input multiplexer including inverter inv1, and tristate inverters M1 and M2. One of the tristate inverters M1 and M2 drives tristate inverter M3 coupled to the SET FF. Scan select or enable ssb controls the tristate inverters M1 and M2. The master latch consists of tristate inverter M3, inverter M4, and tristate inverter M5. The slave latch consists of inverter M7 and tristate inverter M8 coupled to the master latch via transmission pass gate M6. Inverter M12 drives the output of the slave latch as output q. The tristate inverters M3, M5, and M8, and transmission pass-gate M6 are controlled by clock signals clk# and clk## generated by inverters inv2 and inv3. Flip-flops generally contribute approximately 60% of the total clock power of a chip, and any extra power consumed in DET flip-flop 100 may lower the overall power savings achieved by half frequency double edge triggered clocking. Hence, to achieve maximum power gain at block level using half frequency clock, a low power DET flip-flop is desired.

Figure 3:
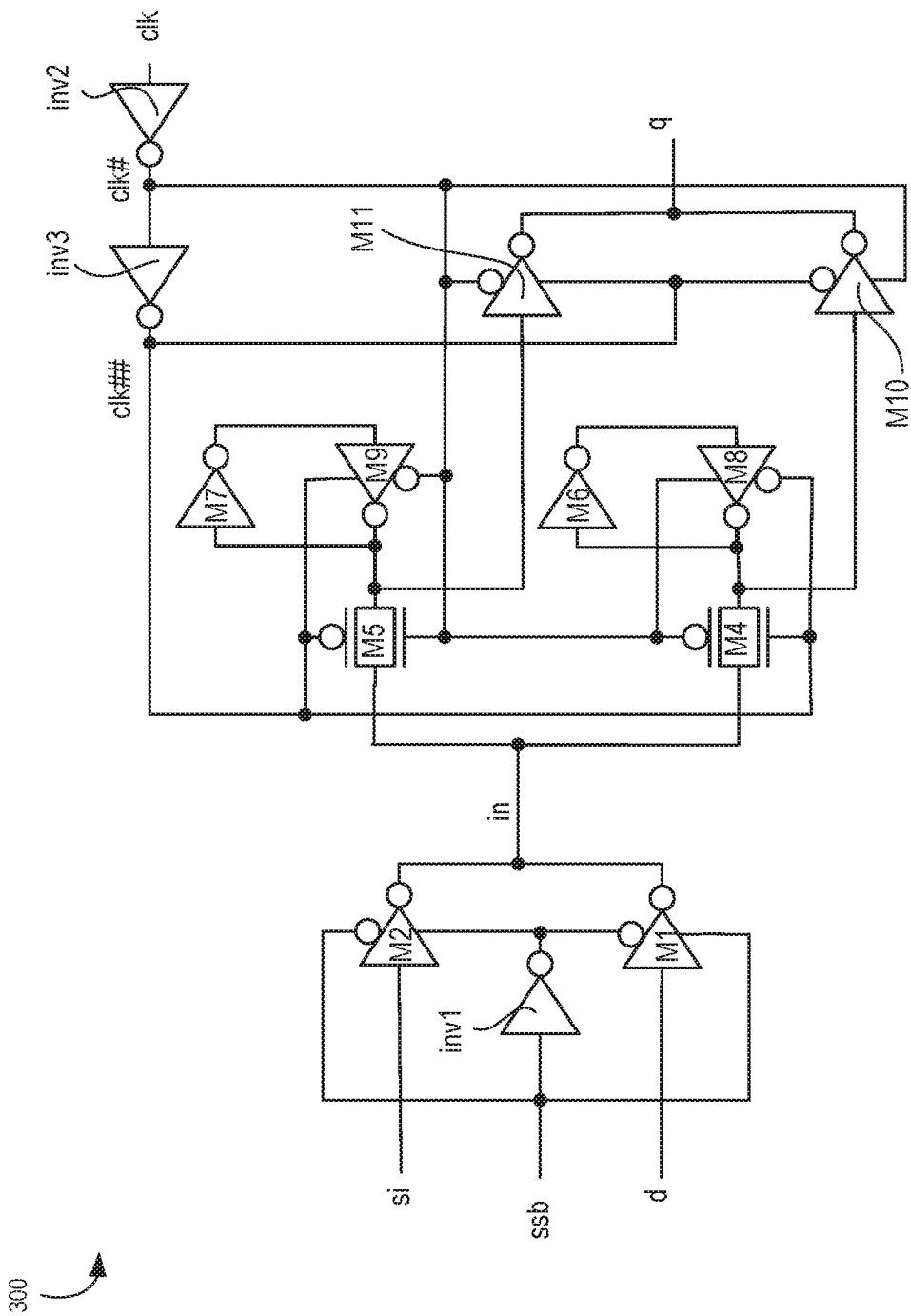
FIG. 3 illustrates a Tri-Tri DET Mux-D scan FF, in accordance with some embodiments.

FIG. 3 illustrates Tri-Tri DET Mux-D scan FF 300, in accordance with some embodiments. FF 300 comprises a scan input multiplexer including inverter inv1, and tristate inverters M1 and M2. Scan select or enable ssb controls the tristate inverters M1 and M2. FF 300 includes two master latches—first and second master latches.

The first master latch comprises transmission pass-gate M5 and a memory element (M7 and M9), where M7 is an inverter and M9 is a tristate inverter. The second master latch comprises transmission pass-gate M4 and a memory element (M6 and M8), where M6 is an inverter and M8 is a tristate inverter. The output of the first master latch is coupled to the input of tristate M11. The output of the second master latch is coupled to the input of tristate inverter M10. The outputs of either M10 or M11 is then provided as output q. Clock signals clk# and clk## from inverters inv2 and inv3 control the tristate inverters M8, M9, M10, and M11, and transmission pass-gates M4 and M5.

In various embodiments, the scan multiplexer (e.g., inv1, M1, M2) selects one of data input or scan input "si". FF 300 comprises a first master latch (e.g., M5, M7, M9) coupled to the output (node in) of the scan multiplexer. FF 300 comprises a second master latch (e.g., M4, M6, M8) coupled to the output (node in) of the scan multiplexer, where the first master latch is transparent when a clock clk is low, and where the second master latch is transparent when the clock is high. FF 300 comprises a first tristate inverter (e.g., M11) coupled to the first master latch; and a second tristate inverter (e.g., M10) coupled to the second master latch, wherein one of the first or second tristate inverters is to drive a signal directly to an output node 'q'. In some embodiments, the clock controls the first and second tristate inverters (M10 and M11). In some embodiments, the output node 'q' is independent of a keeper circuit. For example, there is no memory element or keeper device on the outputs of first and second tristate inverter.

In some embodiments, the first master latch comprises a first transmission gate (M5); and a first memory element (e.g., M7 and M9) coupled to the first transmission gate. In some embodiments, the second master latch comprises a second transmission gate (M4); and a second memory element (e.g., M6 and M8) coupled to the second transmission gate. In some embodiments, the scan multiplexer comprises: a third tristate inverter (M2) coupled to the scan input (si), and controllable by a scan select signal (ssb); and a fourth tristate inverter (M1) coupled to the data input (d), and controllable by the scan select signal (ssb).

As discussed with reference to FIG. 5, in some embodiments, the first tristate inverter comprises a first inverter (501) coupled to the first master latch; and a first pass-gate (503) connected to an output of the first inverter and the output node. In some embodiments, the second tristate inverter comprises a second inverter (502) coupled to the second master latch; and a second pass-gate (504) connected to an output of the second inverter and the output node (q).

As discussed with reference to FIG. 6, in some embodiments, the scan multiplexer comprises a third tristate inverter (M2) coupled to a scan input (si). A scan select signal (ssb) controls the third tristate inverter M2. The scan multiplexer comprises an inverter (601) coupled to a data input (d); and a pass-gate (602) coupled to the inverter. The scan select signal ssb controls pass-gate (602).

Referring back to FIG. 3, DET flip-flop 300 is designed with two master latches, which are 1) transparent when clock is "0", and 2) transparent when clock is "1", followed by a clock selected multiplexer (Mux) to choose between the two master latches. The Mux output does not have any keeper/state node in FF 300. In FF 300, the Mux of DET flip-flop 100 is converted into two tristate inverters (M10 and M11), by removing output inverter (M12 in FF 100). Hence, the name Tri-Tri. Since there is no state node at the Mux output and the tristate inverters M10 and M11 block any coupling/glitch affecting master state nodes, this conversion does not affect the functionality of the flip-flop. Both master cross-coupled keepers (M6/M8 and M7/M9) are pushed into the side path and M3 inverter (in FF 100) in DET flip-flop 100 is removed to create Tri-Tri DET flip-flop 300. In various embodiments, Tri-Tri DET flip-flop 300 has merely two inverters in the forward delay path compared to four in DET FF 100. Removal of these inverters reduces the power consumption in Tri-Tri DET FF 300 compared to DET FF 100.

Figure 4:
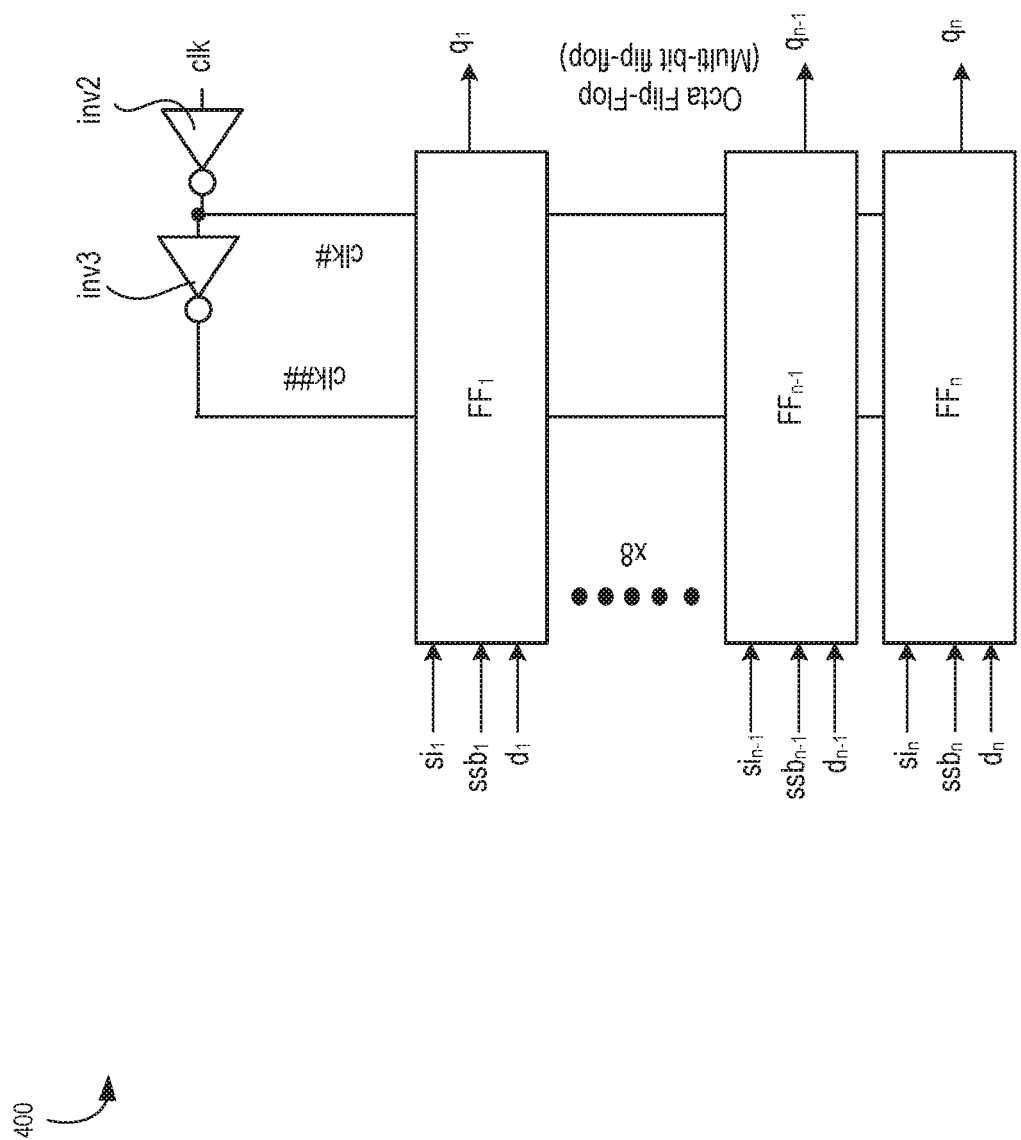
FIG. 4 illustrates a vectored or multi-bit Tri-Tri DET Mux-D scan FF, in accordance with some embodiments.

FIG. 4 illustrates a vectored or multi-bit Tri-Tri DET Mux-D scan FF 400, in accordance with some embodiments. In some embodiments, most of flip-flops 300 are combined into one multi-bit standard cell with shared local clock inverters to reduce power. The reduced clock power in multi-bit flip-flop results in the data power to be significant portion of total power consumed by the FF. The removal of data inverters in tri-tri DET flip-flop 300 reduces data power consumption in these multi-bit flip-flops, resulting in significant power savings. Here, clock inverters inv2 and inv3 are shared with $FF_1$ through $FF_n$, where each FF has a structure same as that of FF 300 except for the clock inverters. Each FF receives a corresponding input (e.g., $si_1$, $ssb_1$, $d_1$ for $FF_1$; $si_{n-1}$, $ssb_{n-1}$, $d_{n-1}$ for $FF_{n-1}$; and $si_n$, $ssb_n$, $d_n$ for $FF_n$).

Table 1 shows a summary of the Clk2Q (clock-to-output), setup and D-Q (data-to-output) delay in arbitrary units (au) for both rising edge and falling edge of the clock. Here, the output load is large (e.g., in a range of fan-out (FO) of four loads, FO4 loads). Same process technology node, temperature, and supply voltage is used for all cases.

TABLE 1

| Vectored FF | Clock toggle | Rise-to-Rise (a.u) | | | Fall-to-Fall (a.u) | | | Worst Case | | |
|---|---|---|---|---|---|---|---|---|---|---|
| | | setup | Clk2Q | D-Q | setup | Clk2Q | D-Q | setup | Clk2Q | D-Q |
| SET FF 200 | rise | 1.0 | 2.2 | 3.2 | 1.7 | 1.8 | 3.5 | 1.7 | 2.2 | 3.9 |
| DET FF 100 | rise | 1.1 | 2.2 | 3.3 | 1.8 | 1.7 | 3.5 | 1.8 | 2.2 | 4.0 |
| | fall | 1.7 | 1.7 | 3.4 | 1.1 | 2.2 | 3.3 | | | |
| Tri-Tri FF 300 | rise | 1.8 | 1.6 | 3.4 | 1.3 | 2.2 | 3.5 | 2.1 | 2.3 | 4.4 |
| | fall | 1.0 | 2.3 | 3.3 | 2.1 | 1.6 | 3.7 | | | |

Table 2 shows the power savings achieved by proposed DET flip-flop.

TABLE 2

| | Total Power Savings | | | |
|---|---|---|---|---|
| Vectored FF | Activity factor (AF) = 0% | AF = 10% | AF = 20% | AF = 100 % |
| SET FF 200 | — | — | — | — |
| DET FF 100 | 25% | 15% | 8% | −13% |
| Tri-Tri DET FF 300 | 27% | 23% | 19% | 9% |

Since tristate inverters M10 and M11 drive the output of tri-tri DET flip-flop 300, the drive strength of FF 300 is lower than the drive strength of DET FF 100 or SET FF 200. This lower drive strength of FF 300 results in large Clk2Q (clock-to-output delay) for Tri-Tri DET 300 when driving large output load (e.g., in a range of FO4 loads), showing 0.5 au (arbitrary unit) reduction in worst case D-Q compared to SET flip-flop 200. However, for smaller output loads (e.g., less than FO1 instead of in a range of FO4 loads) the worst case D-Q overhead is merely 0.1 au (as shown in Table 3) which is comparable to DET FF 100. Same process technology node, temperature, and supply voltage is used for all cases in Table 3 (i.e., same as Table 1 and Table 2 conditions)

TABLE 3

| Vectored FF | Clock toggle | Rise-to-Rise (a.u) | | | Fall-to-Fall (a.u) | | | Worst Case | | |
|---|---|---|---|---|---|---|---|---|---|---|
| | | setup | Clk2Q | D-Q | setup | Clk2Q | D-Q | setup | Clk2Q | D-Q |
| SET FF 200 | rise | 1.0 | 1.6 | 2.6 | 1.7 | 1.2 | 2.9 | 1.7 | 1.6 | 3.3 |
| Tri-Tri FF 300 | rise | 1.7 | 0.9 | 2.6 | 1.3 | 1.4 | 2.7 | 2.0 | 1.4 | 3.4 |
| | fall | 1.0 | 1.4 | 2.4 | 2.0 | 0.9 | 2.9 | | | |

Table 2 shows that Tri-Tri DET flip-flop 300 results in 19% power savings over SET flip-flop 200 at typical 20% data activity, while DET flip-flop 100 merely results in 8% power savings. These results show that Tri-Tri DET flip-flop 300 provides a minimum drive strength flip-flop good for smaller loads (e.g., loads less than FO1 load), with minimal delay overhead compared to SET FF 200, while achieving lower power than DET flip-flop 200.

Figure 5:
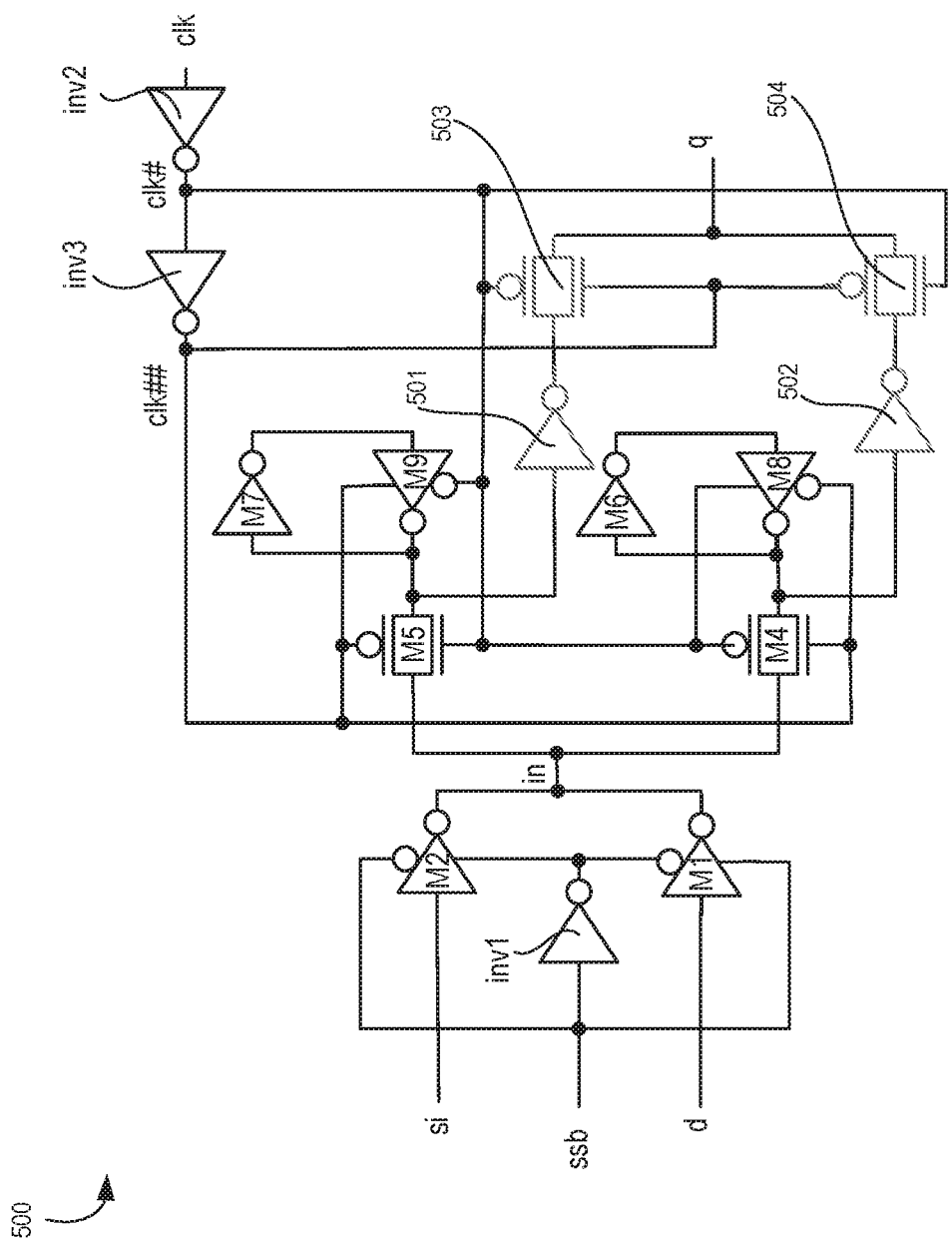
FIG. 5 illustrates a Tri-Tran DET Mux-D scan FF, in accordance with some embodiments.

FIG. 5 illustrates Tri-Tran DET Mux-D scan FF 500, in accordance with some embodiments. FF 500 is same as FF 300 but with output tristate inverters M10 and M11 are converted into inverter/pass gate 501 and 503, and 502 and 504, respectively, to gain back some delay overhead when driving large load, while trading off power.

Figure 6:
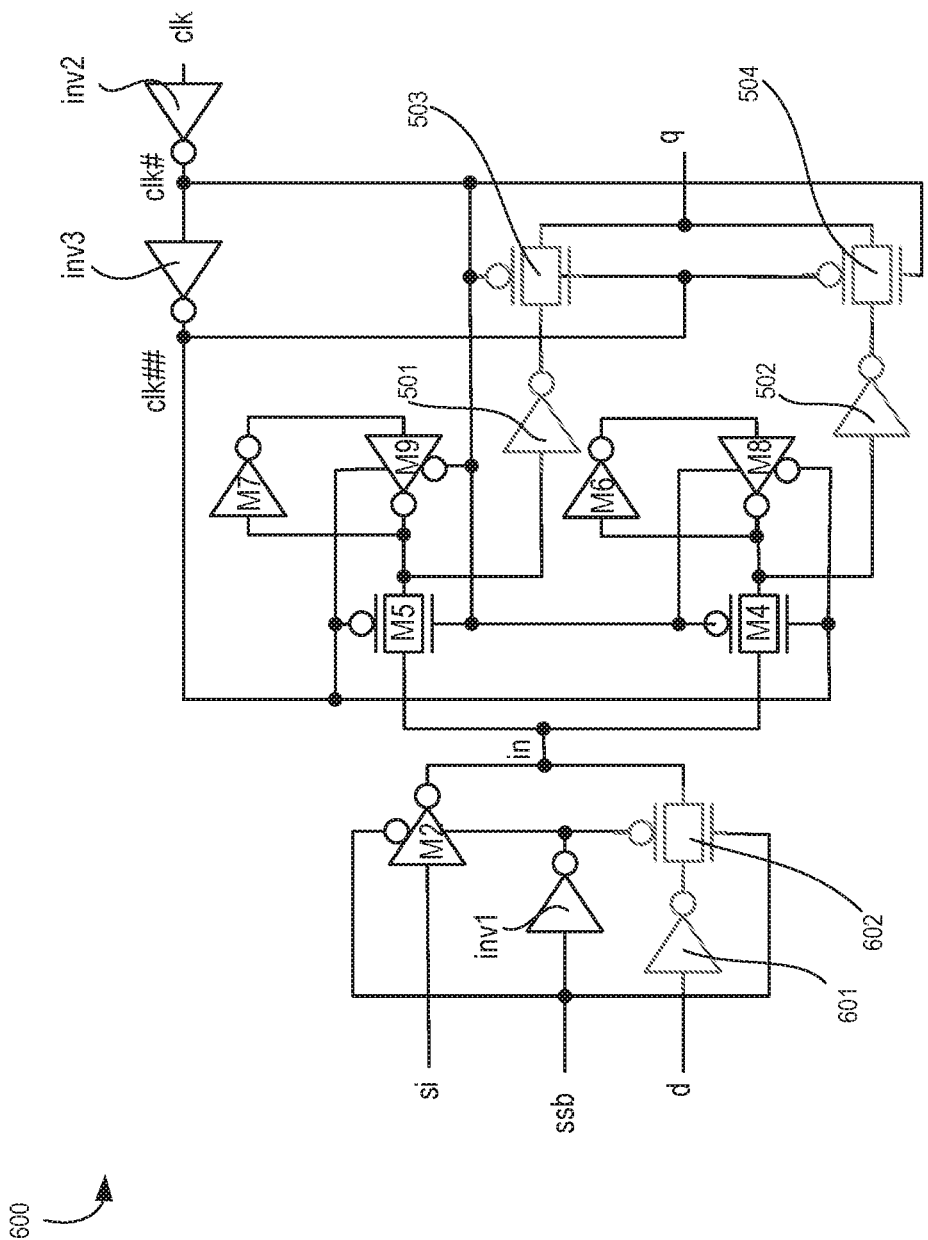
FIG. 6 illustrates a Tran-Tran DET Mux-D scan FF, in accordance with some embodiments.

FIG. 6 illustrates Tran-Tran DET Mux-D scan FF 600, in accordance with some embodiments. FF 600 is same as FF 300 but where both input/output tristate inverters M1, M10 and M11 are converted into inverter/pass gate 601 and 602, 501 and 503, and 502 and 504, respectively, to gain back some delay overhead when driving large load, while trading off power.

Table 4 shows the worst-case D-Q timing and the power savings achieved by these designs for a large output load. Same process technology node, temperature, and supply voltage is used for all cases in Table 3 (i.e., same as Table 1 and Table 2 conditions)

TABLE 4

| Vectored FF | Worst Case Delay (a.u) | | | Total Power Savings % | | |
|---|---|---|---|---|---|---|
| | setup | Clk2Q | D-Q | AF = 0% | AF = 2-% | AC = 100% |
| SET FF 200 | 1.7 | 2.2 | 3.9 | — | — | — |
| DEF FF 100 | 1.8 | 2.2 | 4.0 | 25 | 8 | −13 |
| Tri-Tri DET FF 300 | 2.1 | 2.3 | 4.4 | 27 | 19 | 9 |
| Tri-Tran DET FF 500 | 2.1 | 1.9 | 4.0 | 27 | 14 | −3 |
| Tran-Tran DET FF 600 | 2.1 | 1.8 | 3.9 | 27 | 12 | −8 |

The Tri-Tran FF 600 has comparable worst case D-Q as DET FF 100, while saving 14% power (DET FF 100 saves merely 8% power) over SET flip-flop 200 at 20% data activity. Tran-Tran FF 620 shows faster performance than DET FF 100 while saving 12% power over SET flip-flop 200.

In various embodiments, the inverters can be replaced with logic gates such as NAND gate or NOR gate that are configured as inverters and can also be used to force a logic output using an enable signal (e.g., power saving mode).

Figure 7:
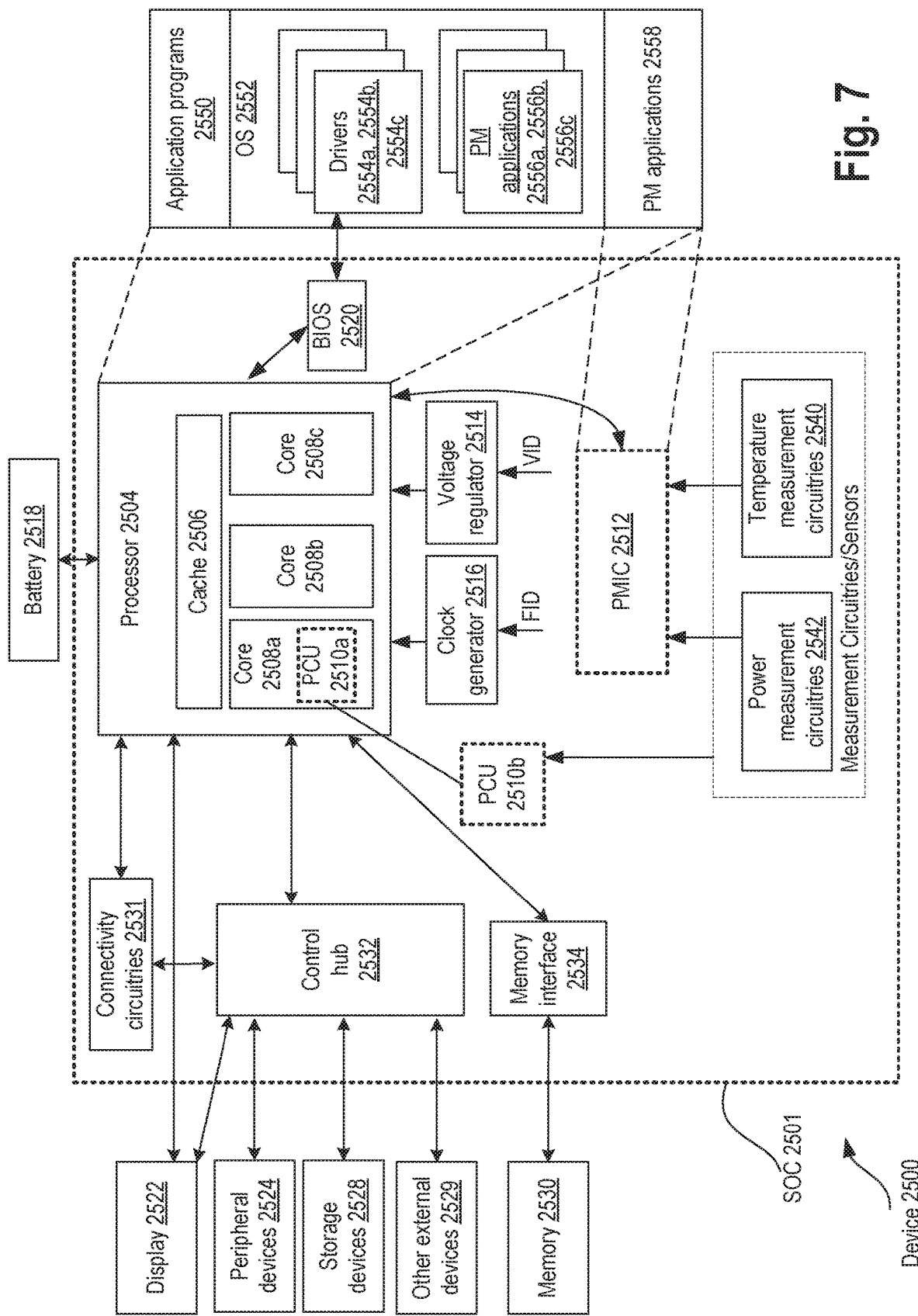
FIG. 7 illustrates a smart device, or a computer system, or a SoC (System-on-Chip) with Tri-Tri DET Mux-D scan FF, Tri-Tran DET Mux-D scan FF, and/or Tran-Tran DET Mux-D scan FF, according to some embodiments of the disclosure.

FIG. 7 illustrates a smart device, or a computer system, or a SoC (System-on-Chip) with Tri-Tri DET Mux-D scan FF, Tri-Tran DET Mux-D scan FF, and/or Tran-Tran DET Mux-D scan FF, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here can have Tri-Tri DET Mux-D scan FF, Tri-Tran DET Mux-D scan FF, and/or Tran-Tran DET Mux-D scan FF. For example, any critical timing path can use the Tri-Tri DET Mux-D scan FF, Tri-Tran DET Mux-D scan FF, and/or Tran-Tran DET Mux-D scan FF.

In an example, the device 2500 comprises a SoC (System-on-Chip) 2501. An example boundary of the SOC 2501 is illustrated using dotted lines in FIG. 7, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 may be shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions may be fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508a, 2508b, 2508c, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514. VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510a/b and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510*a*. In an example, some other sections of PCU 2510 may be implemented outside the processing cores 2508, and these sections of PCU 2510 are symbolically illustrated using a dotted box and labelled as PCU 2510*b*. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556*a*, 2556*b*, 2556*c*. The OS 2552 may also include various drivers 2554*a*, 2554*b*, 2554*c*, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: a scan multiplexer to select one of data input or scan input; a first master latch coupled to an output of the scan multiplexer; a second mater latch coupled to the output of the scan multiplexer, wherein the first master latch is transparent when a clock is low, and wherein the second master latch is transparent when the clock is high; a first tristate inverter coupled to the first master latch; and a second tristate inverter coupled to the second master latch, wherein one of the first or second tristate inverters is to drive a signal directly to an output node.

Example 2

The apparatus of example 1, wherein the first and second tristate inverters are controllable by the clock.

Example 3

The apparatus of example 1, wherein the output node is independent of a keeper circuit.

Example 4

The apparatus of example 1, wherein the first master latch comprises: a first transmission gate; and a first memory element coupled to the first transmission gate.

Example 5

The apparatus of example 1, wherein the second master latch comprises: a second transmission gate; and a second memory element coupled to the second transmission gate.

Example 6

The apparatus of example 1, wherein the scan multiplexer comprises: a third tristate inverter coupled to the scan input, and controllable by a scan select signal; and a fourth tristate inverter coupled to the data input, and controllable by the scan select signal.

Example 7

The apparatus of example 1, wherein the scan multiplexer comprises: a third tristate inverter coupled to the scan input, and controllable by a scan select signal; an inverter coupled to the data input; and a pass-gate coupled to the inverter, wherein the pass-gate controllable by the scan select signal.

Example 8

The apparatus of example 1, wherein the first tristate inverter comprises: a first inverter coupled to the first master latch; and a first pass-gate connected to an output of the first inverter and the output node.

Example 9

The apparatus of example 8, wherein the second tristate inverter comprises: a second inverter coupled to the second master latch; and a second pass-gate connected to an output of the second inverter and the output node.

Example 10

An apparatus comprising: a clocking circuitry to provide a clock and an inverse of the clock; and a vectored flip-flop circuitry comprising a plurality of flip-flops, wherein each flip-flop of the plurality shares the clocking circuitry, wherein each flip-flop of the plurality comprises: a scan multiplexer to select one of data input or scan input; a first master latch coupled to an output of the scan multiplexer; a second mater latch coupled to the output of the scan multiplexer, wherein the first master latch is transparent when the clock is low, and wherein the second master latch is transparent when the clock is high; a first tristate inverter coupled to the first master latch; and a second tristate inverter coupled to the second master latch, wherein one of the first or second tristate inverters is to drive a signal directly to an output node.

Example 11

The apparatus of example 10, wherein the first and second tristate inverters are controllable by the clock.

Example 12

The apparatus of example 10, wherein the output node is independent of a keeper circuit.

Example 13

The apparatus of example 10, wherein the first master latch comprises: a first transmission gate; and a first memory element coupled to the first transmission gate.

Example 14

The apparatus of example 10, wherein the second master latch comprises: a second transmission gate; and a second memory element coupled to the second transmission gate.

Example 15

The apparatus of example 10, wherein the scan multiplexer comprises: a third tristate inverter coupled to the scan input, and controllable by a scan select signal; and a fourth tristate inverter coupled to the data input, and controllable by the scan select signal.

Example 16

The apparatus of example 10, wherein the scan multiplexer comprises: a third tristate inverter coupled to the scan input, and controllable by a scan select signal; an inverter coupled to the data input; and a pass-gate coupled to the inverter, wherein the pass-gate controllable by the scan select signal.

Example 17

The apparatus of example 10, wherein the first tristate inverter comprises: a first inverter coupled to the first master latch; and a first pass-gate connected to an output of the first inverter and the output node.

Example 18

The apparatus of example 17, wherein the second tristate inverter comprises: a second inverter coupled to the second master latch; and a second pass-gate connected to an output of the second inverter and the output node.

Example 19

A system comprising: a memory; a processor coupled to the memory, wherein the processor include a flip-flop comprising: a scan multiplexer to select one of data input or scan input; a first master latch coupled to an output of the scan multiplexer; a second mater latch coupled to the output of the scan multiplexer, wherein the first master latch is transparent when a clock is low, and wherein the second master latch is transparent when the clock is high; a first tristate inverter coupled to the first master latch; and a second tristate inverter coupled to the second master latch, wherein one of the first or second tristate inverters is to drive a signal directly to an output node; and a wireless interface to allow the processor to communicate with another device.

Example 20

The system of example 19, wherein the first and second tristate inverters are controllable by the clock, and wherein the output node is independent of a keeper circuit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
    a scan multiplexer to select one of data input or scan input;
    a first master latch coupled to an output of the scan multiplexer;
    a second master latch coupled to the output of the scan multiplexer, wherein the first master latch is transparent when a clock is low, and wherein the second master latch is transparent when the clock is high;
    a first tristate inverter coupled to the first master latch; and
    a second tristate inverter coupled to the second master latch, wherein one of the first or second tristate inverters is to drive a signal directly to an output node.

2. The apparatus of claim 1, wherein the first and second tristate inverters are controllable by the clock.

3. The apparatus of claim 1, wherein the output node is independent of a keeper circuit.

4. The apparatus of claim 1, wherein the first master latch comprises:
    a first transmission gate; and
    a first memory element coupled to the first transmission gate.

5. The apparatus of claim 1, wherein the second master latch comprises:
    a second transmission gate; and
    a second memory element coupled to the second transmission gate.

6. The apparatus of claim 1, wherein the scan multiplexer comprises:
    a third tristate inverter coupled to the scan input, and controllable by a scan select signal; and
    a fourth tristate inverter coupled to the data input, and controllable by the scan select signal.

7. The apparatus of claim 1, wherein the scan multiplexer comprises:
    a third tristate inverter coupled to the scan input, and controllable by a scan select signal;
    an inverter coupled to the data input; and
    a pass-gate coupled to the inverter, wherein the pass-gate controllable by the scan select signal.

8. The apparatus of claim 1, wherein the first tristate inverter comprises:
    a first inverter coupled to the first master latch; and
    a first pass-gate connected to an output of the first inverter and the output node.

9. The apparatus of claim 8, wherein the second tristate inverter comprises:
    a second inverter coupled to the second master latch; and
    a second pass-gate connected to an output of the second inverter and the output node.

10. An apparatus comprising:
    a clocking circuitry to provide a clock and an inverse of the clock; and
    a vectored flip-flop circuitry comprising a plurality of flip-flops, wherein each flip-flop of the plurality shares the clocking circuitry, wherein each flip-flop of the plurality comprises:
        a scan multiplexer to select one of data input or scan input;

a first master latch coupled to an output of the scan multiplexer;

a second master latch coupled to the output of the scan multiplexer, wherein the first master latch is transparent when the clock is low, and wherein the second master latch is transparent when the clock is high;

a first tristate inverter coupled to the first master latch; and a second tristate inverter coupled to the second master latch, wherein one of the first or second tristate inverters is to drive a signal directly to an output node.

11. The apparatus of claim 10, wherein the first and second tristate inverters are controllable by the clock.

12. The apparatus of claim 10, wherein the output node is independent of a keeper circuit.

13. The apparatus of claim 10, wherein the first master latch comprises:

a first transmission gate; and a first memory element coupled to the first transmission gate.

14. The apparatus of claim 10, wherein the second master latch comprises:

a second transmission gate; and a second memory element coupled to the second transmission gate.

15. The apparatus of claim 10, wherein the scan multiplexer comprises:

a third tristate inverter coupled to the scan input, and controllable by a scan select signal; and a fourth tristate inverter coupled to the data input, and controllable by the scan select signal.

16. The apparatus of claim 10, wherein the scan multiplexer comprises:

a third tristate inverter coupled to the scan input, and controllable by a scan select signal;

an inverter coupled to the data input; and a pass-gate coupled to the inverter, wherein the pass-gate controllable by the scan select signal.

17. The apparatus of claim 10, wherein the first tristate inverter comprises:

a first inverter coupled to the first master latch; and a first pass-gate connected to an output of the first inverter and the output node.

18. The apparatus of claim 17, wherein the second tristate inverter comprises:

a second inverter coupled to the second master latch; and a second pass-gate connected to an output of the second inverter and the output node.

19. A system comprising:

a memory;

a processor circuitry coupled to the memory, wherein the processor circuitry includes a flip-flop comprising:

a scan multiplexer to select one of data input or scan input;

a first master latch coupled to an output of the scan multiplexer;

a second master latch coupled to the output of the scan multiplexer, wherein the first master latch is transparent when a clock is low, and wherein the second master latch is transparent when the clock is high;

a first tristate inverter coupled to the first master latch; and a second tristate inverter coupled to the second master latch, wherein one of the first or second tristate inverters is to drive a signal directly to an output node; and a wireless interface to allow the processor circuitry to communicate with another device.

20. The system of claim 19, wherein the first and second tristate inverters are controllable by the clock, and wherein the output node is independent of a keeper circuit.

* * * * *